United States Patent [19]
Kondo

[11] Patent Number: 5,545,849
[45] Date of Patent: Aug. 13, 1996

[54] ELECTRONIC COMPONENT DEVICE AND ITS MANUFACTURING METHOD

[75] Inventor: Shuji Kondo, Takarazuka, Japan

[73] Assignee: Matsushita Electric Industrial Co., Ltd., Osaka, Japan

[21] Appl. No.: 309,162

[22] Filed: Sep. 20, 1994

[30] Foreign Application Priority Data

Jan. 31, 1994 [JP] Japan .................. 6-009203

[51] Int. Cl.$^6$ .................................. H01L 23/02
[52] U.S. Cl. ................ 174/52.4; 257/698; 437/209
[58] Field of Search ................ 174/52.1, 52.2, 174/52.3, 52.4, 35 R; 228/179.1, 180.1, 180.21; 257/678, 684, 688, 690, 692, 698; 310/340, 344, 348; 361/816, 818, 820, 728; 437/209

[56] References Cited

U.S. PATENT DOCUMENTS

| | | | |
|---|---|---|---|
| 3,387,365 | 6/1968 | Stelmak | 257/778 |
| 3,887,783 | 6/1975 | Cornette | 219/85 |
| 4,639,631 | 1/1987 | Chason et al. | |
| 4,905,075 | 2/1990 | Temple et al. | 357/74 |
| 5,065,506 | 11/1991 | Kiribayashi | 29/632 |
| 5,098,864 | 3/1992 | Mahulikar | 437/221 |
| 5,248,901 | 9/1993 | Temple | 257/678 |
| 5,250,870 | 10/1993 | Fenlon et al. | 310/345 |
| 5,261,157 | 11/1993 | Chang | 29/844 |
| 5,288,007 | 2/1994 | Interrante et al. | 228/119 |
| 5,376,860 | 12/1994 | Sato | 310/346 |

FOREIGN PATENT DOCUMENTS

| | | | |
|---|---|---|---|
| 154536 | 8/1985 | Japan | 257/737 |
| 123990 | 6/1986 | Japan | 361/783 |
| 62-056012 | 8/1987 | Japan . | |

OTHER PUBLICATIONS

Nachrichten Technik Elektronik, "Mikrokontaktieren An Wandlerstrukturen Von Oberflachenwellenfiltern", H. Opitz et al., pp. 68–70 (1980).

*Primary Examiner*—Kristine L. Kincaid
*Assistant Examiner*—Robert J. Decker
*Attorney, Agent, or Firm*—McDermott, Will & Emery

[57] ABSTRACT

The invention is an electronic component device in the form of an envelope including a glass cover and a glass shell bonded together for hermetically sealing a surface acoustic filter inside the envelope. Electrical connections are provided from the filter's electrodes to the outside of the envelope by means of through holes in the cover. Each through hole has an electrode disposed around its periphery on the upper and bottom surfaces of the cover and a conductive layer disposed on the internal surface of the hole. A metal foil is formed on the bottom electrode sealing the hole and pressed downward and deformed against a filter electrode to complete a connection between the filter electrode, the metal foil, the conductor layer and the electrodes disposed around the periphery of the hole, and to hermetically seal the hole.

22 Claims, 6 Drawing Sheets

ELECTRONIC COMPONENT DEVICE AND ITS MANUFACTURING METHOD

BACKGROUND OF THE INVENTION

The present invention relates to an electronic component device comprising electronic elements contained in an envelope, and its manufacturing method.

In a conventional electronic component device, using an envelope of insulating properties to enclose an electronic element having electrodes, terminals are provided on the outside of the envelope for the electronic component element contained in the envelope, said terminals being electrically connected to the electrodes as follows: Through holes are made in the envelope, and the inside of each of these holes is covered or filled with a metallic body. One end of the metallic body exposed inside the envelope is connected to an electrode formed on the electronic component element, and the other end of the metallic body exposed outside the envelope serves as a lead out terminal.

A problem involved with the foregoing prior art is that the process for fabricating the connection between the metallic body and the electrode on the electronic component element tends to be complicated.

More specifically, the foregoing connections are performed or fabricated by first forming a projecting bump either on the metallic body exposed inside the envelope or on the electrode of the electronic component element, and then pressing the bump against the opposing object.

In particular, the problem with the conventional connection forming process is that forming the aforementioned bump requires a plating process. It takes a long time to form the projecting bump by the plating process. Also, various masks have to be prepared before the plating process can start. Hence, the use of a projecting bump and the plating steps needed to form the bump require a complex connection forming processes. The prior art described above does not provide the important advantages of the simplified connection forming process according to the instant invention.

SUMMARY OF THE INVENTION

The object of the present invention is to provide an electronic component device whereby the processes for forming connections, between the electrodes of an electronic component element contained in an envelope of electrically insulating properties and external connecting terminals disposed on the envelope, are simplified.

In order to achieve the foregoing object, the electronic component device of the present invention comprises an envelope of insulating properties, an electronic component element having electrodes contained in the foregoing envelope, through holes made at specified places of the envelope, an electro-conductive layer disposed all over the internal surface of each of the through holes made at said specified places of the envelope, and a metal foil, which covers tightly a through hole's opening, situated inside the envelope and connecting an electrode formed on the electronic component element.

According to the foregoing structures, the metal foil is pressed and deformed, against the electrode formed on the electronic component element to complete a connection between the foil and the electrode, resulting in a simplified connecting process. The instant process provides the important advantages of no longer needing to form projecting bumps by a plating process as required by the prior art. Also, the photoprocessing steps used in the plating process are no longer required either. Consequently, the structures of the electronic component device are much simpler to make.

The invention itself, together with further objects and attendant advantages, will best be understood by reference to the following detailed description taken in conjunction with the accompanying drawings.

DETAILED DESCRIPTION OF THE INVENTION

The present invention will be explained with the help of the following examples and the drawings.

EXAMPLE 1

Figure 1:
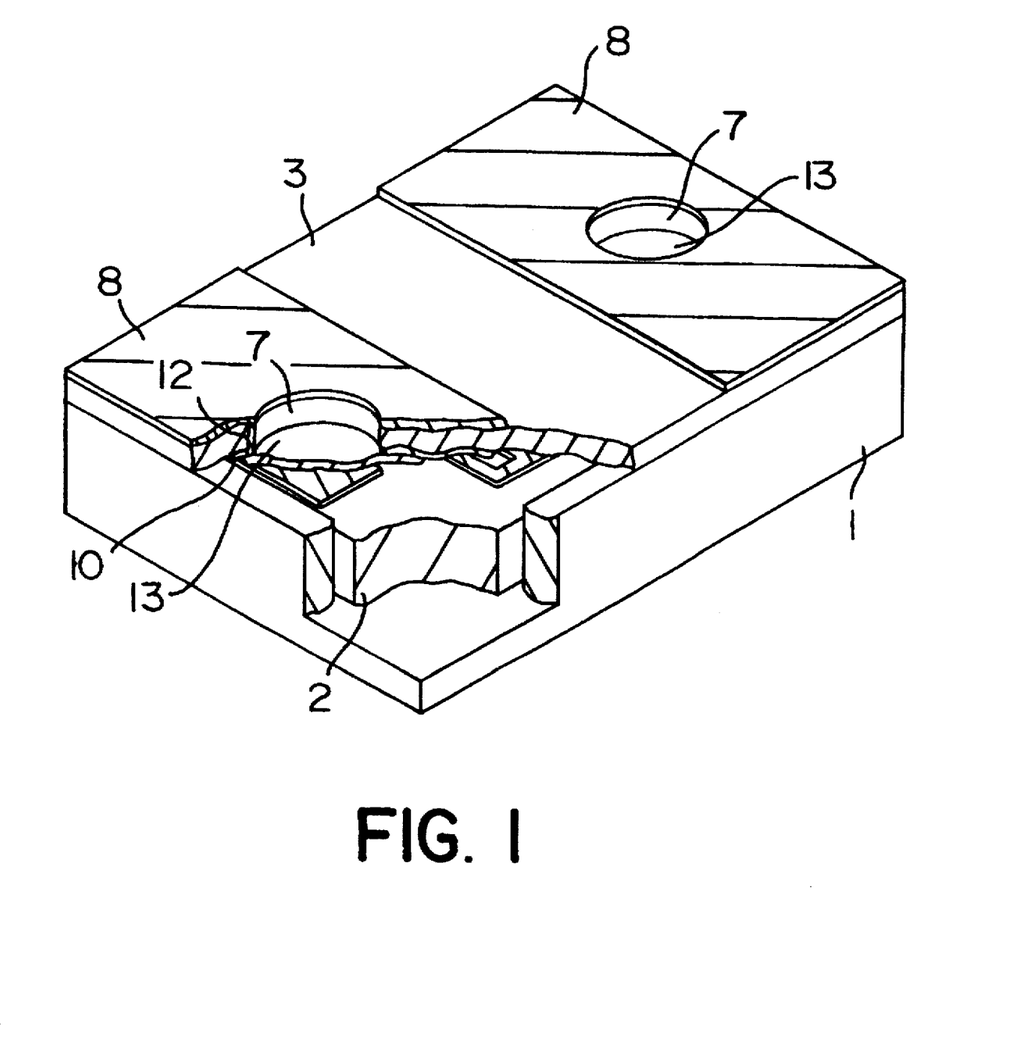
FIG. 1 is a partially cut away perspective view of an electronic component device of a first embodiment of the present invention.
Figure 2:
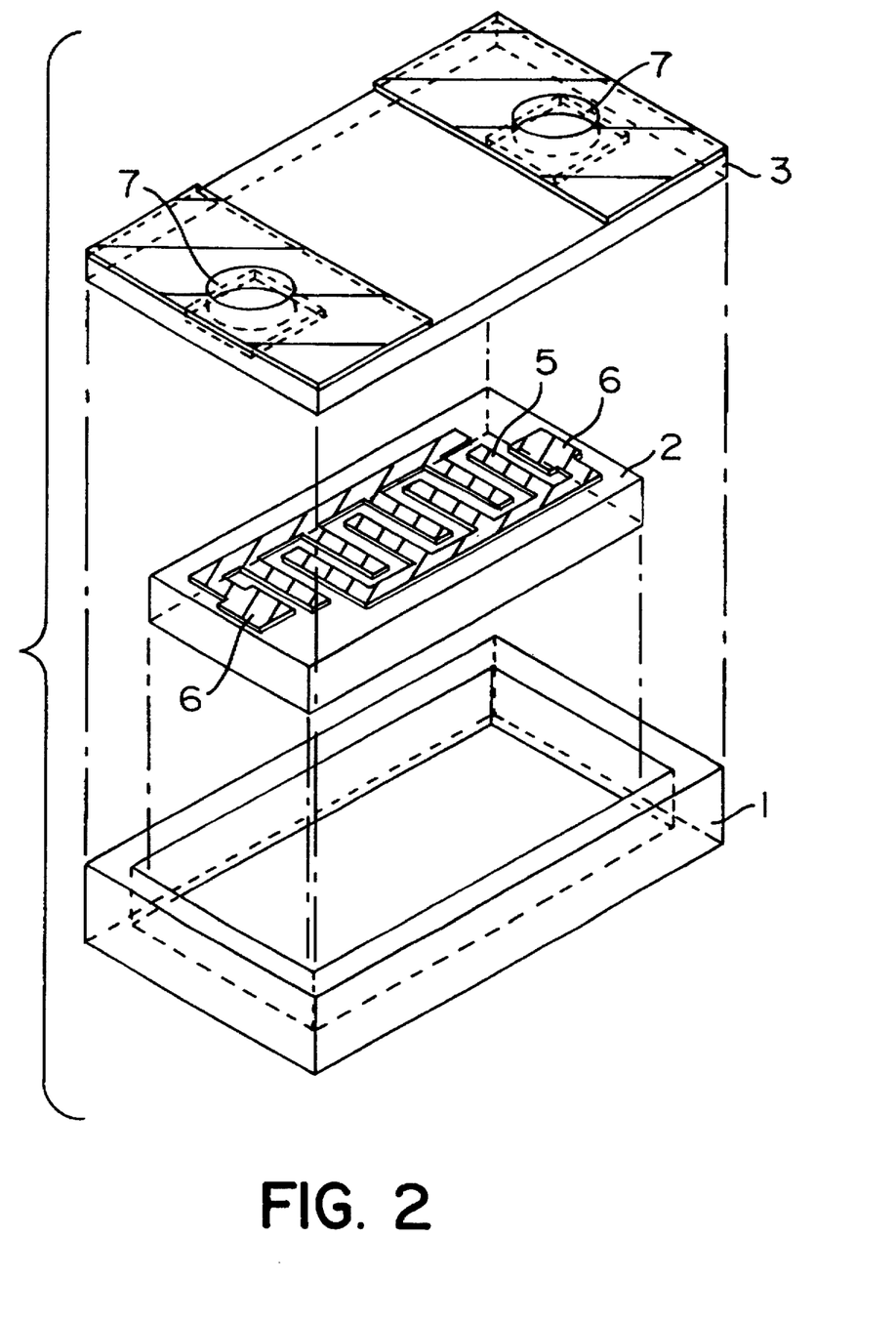
FIG. 2 is an exploded perspective view of the electronic component device as shown in FIG. 1.

A partially cut away perspective view of an important part of an exemplary embodiment of an electronic component device of the present invention is shown in FIG. 1. An exploded perspective view of the foregoing electronic component device is shown in FIG. 2.

Figure 3:
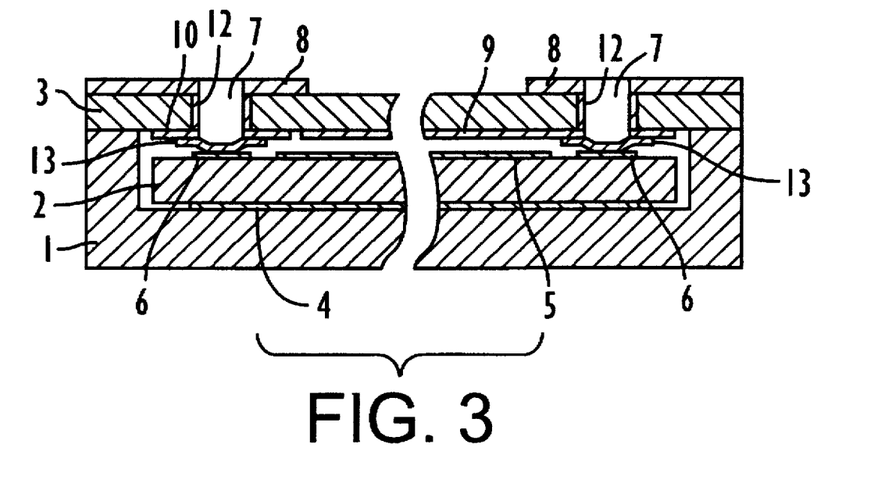
FIG. 3 is a cross-sectional view of the electronic component device as shown in FIG. 1.

Also, a cross-sectional view of the same exemplary embodiment is shown in FIG. 3.

Figure 5:
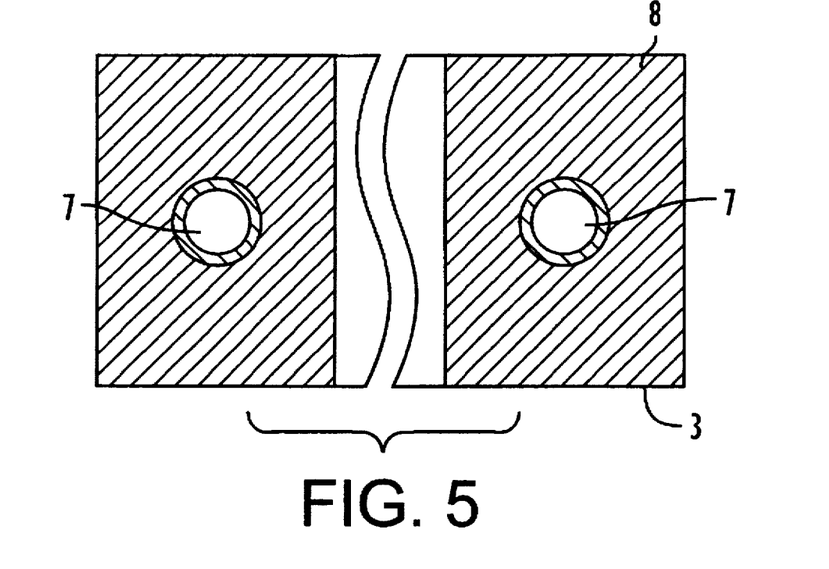
FIG. 5 is a top plan view of a cover of the electronic component device of a first embodiment of the present invention.

A top plan view of the cover of the envelope for the same exemplary embodiment is shown in FIG. 5.

Figure 6:
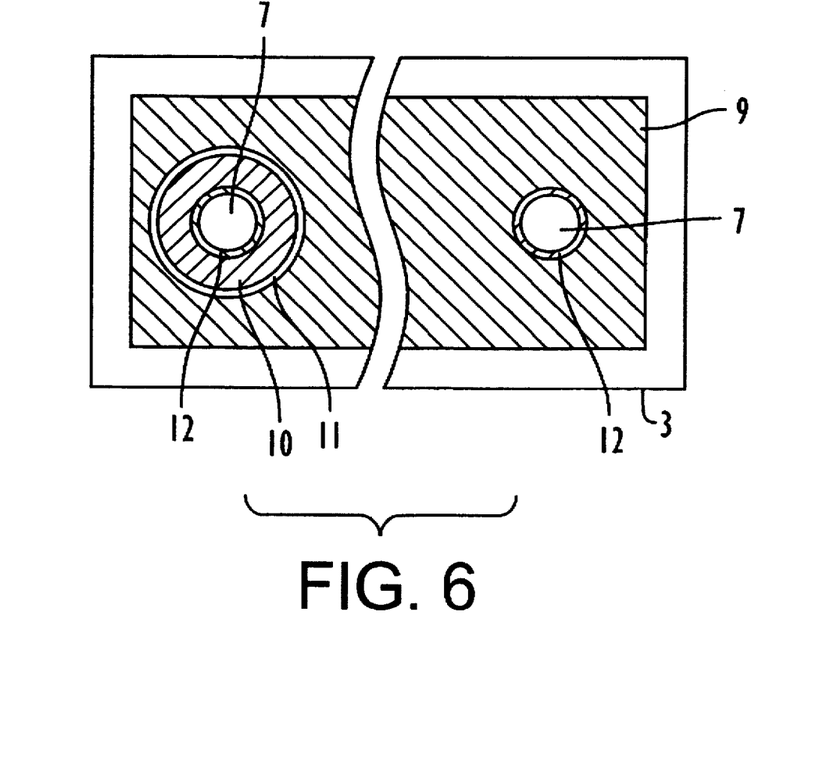
FIG. 6 is a bottom plan view of the cover as shown in FIG. 5.

A bottom plan view of the foregoing cover is shown in FIG. 6.

In FIGS. 1–3, there is illustrated a SAW (Surface Acoustic Wave) filter contained as an electronic component element 2 in a glass-made saucer shell 1 having an open upper side, with its upper opening closed by a cover 3 made of glass. An envelope is formed by the saucer shell 1 and cover 3.

The bottom surface (not shown) of the electronic component element 2 is fixed to the inner bottom of the saucer shell 1 by an adhesive 4.

The upper edge surface of the saucer shell 1 and the opposing periphery of the lower surface of the cover 3 are both mirror finished, and then pressed against each other under a temperature of about 300° C. to form an interatomic bonding there between.

On account of the interatomic bonding realized in putting the saucer shell 1 and cover 3 together, the bonding strength is so strong that both members cannot be separated under the normal conditions of usage in terms of temperature, external mechanical force or the like. The adhesion between the two members is excellent.

As shown in FIG. 2 and FIG. 3, a comb like electrode 5 made of aluminum is formed on the upper surface of the electronic component element 2, and an input or output electrode 6 is formed on each respective end thereof. Two of the through holes 7 are formed in the cover 3 at two positions opposite to the foregoing electrodes 6.

As illustrated in FIG. 1, FIG. 3 and FIG. 5, two electrodes 8, for providing an outside connection to the electrodes 6, are disposed around the periphery of each respective through hole 7 on the upper surface of the cover 3, with an insulator separating the two electrodes 8 from each other.

Also, as shown in FIG. 3 and FIG. 6, a shielding electrode 9 and a connecting electrode 10 are disposed on the bottom surface of the cover 3.

The connecting electrode 10 is shaped like a ring and placed around the periphery of at least one of the through holes 7. Also, as shown in FIG. 6, a ring-like non-electrode member 11 is formed between the connecting electrode 10 and the shielding electrode 9 for separating electrically the former from the latter.

The shielding electrode 9 and connecting electrode 10 are connected respectively by way of an electric conductor 12 formed inside each respective through hole 7, as shown in FIG. 3 to the two electrodes 8, respectively. The two electrodes 8, which are formed on the upper surface of the cover 3 and insulated electrically from each other, are for providing an outside connection to the electrodes 6 inside the device. The shape of the electric conductor 12 is, for example, cylindrical.

Also, as shown in FIG. 1 and FIG. 3, a disc-like metal foil 13, made of aluminum and measuring 5 μm to 200 μm in thickness, covers tightly each respective lower end of the through hole 7 exposed at the bottom surface of the cover 3. The metal foil 13 and the shielding electrode 9 or connecting electrode 10 are fused together at the external periphery of each of the through holes 7. The metal foil forms a hermetic seal for the through hole 7. Accordingly, the whole envelope is sealed air-tight by way the adhesion between the foregoing saucer shell 1 and outer periphery of the cover 3, and the hermetic sealing by the metal foil 13.

The electrodes 6 formed on the electronic component element 2 are connected in series to the metal foils 13, the connecting electrode 10 or shielding electrode 9, the electric conductors 12 and the electrodes 8. Thus, an electrical connection from the electrodes 6 to the outside of the envelope is provided.

Figure 7:
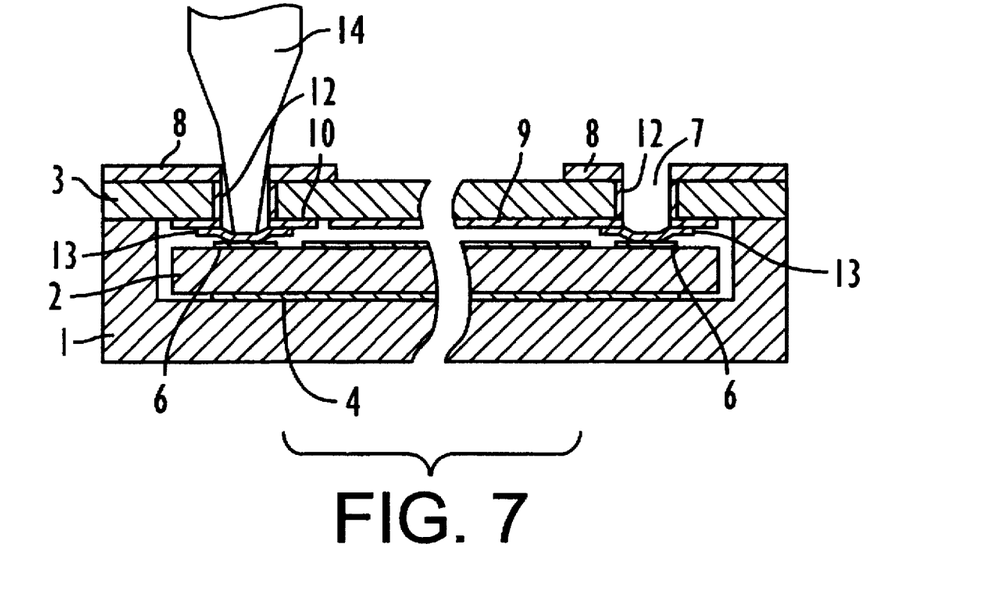
FIG. 7 is a cross-sectional view of an electronic component device of the present invention to show an example of the manufacturing method thereof.

Next, an important aspect of the fabrication process is described. FIG. 7 is a cross-sectional view and is used to explain an important part of the manufacturing method for the present example's electronic component device. In FIG. 7, the same symbols as used in FIG. 3 are employed.

As illustrated in FIG. 7, an ultrasonic transducer or jig 14 is inserted into the through hole 7, and the metal foil 13 is pressed downward and brought in touch with the input or output electrode 6. At this time, ultrasonic vibrations are applied to the ultrasonic transducer 14, and the two members 6 and 13 are ultrasonically welded at the point where the two members meet with each other.

As a result, the electrode 8, used for an outside connection in one section of the electronic component device 1 is connected with the electrode 6 formed on the electronic component element 2 under the same section of said device by way of the electric conductor 12, connecting electrode 10 and metal foil 13.

Also, the other electrode 8 used for the outside connection in another section of the electronic component device 1 is connected electrically with the electrode 6 formed on the electronic component element 2 under the same section by way of the electric conductor 12, shielding electrode 9 and metal foil 13.

The electrodes 8 used for outside connections, shielding electrode 9, connecting electrode 10 and electric conductor 12 can be made of, for example, Au alone, Cu alone, Au film formed on Cu film or the like.

Variations of the materials are possible. In place of aluminum, the metal foil 13 can be made of, for example, Al alone, Au alone, a laminate of Au and Al, a laminate of Au and Sn, a laminate of Au and solder, a laminate of Al and Sn, a laminate of Al and solder, a laminate of Al and Au and Sn, a laminate of Al and Au and solder, a laminate of Au and a barrier layer and Al and a laminate of Au and a barrier layer and Sn, a laminate of Au and a barrier layer and solder, a laminate of Al and a barrier layer and Sn, a laminate of Al and a barrier layer and solder, or the like.

The barrier layer can be made of, for example, Mo, Ti, W, Cr or the like.

In place of glass, the saucer shell 1 and cover 2 can be made of alumina or various ceramics with an electrically insulating property.

Also, in place of a SAW filter, the electronic component element can be a quartz oscillator, a ceramic filter or the like.

Further, in place of Al, the comb-like electrode 5 can be made of, for example, Au, W, Cr or the like.

In addition, the metal foil 13 can be structured in such a way as to have the foil directly connect the electric conductor 12.

It is also possible to employ a structure wherein the connecting electrode 10 and shielding electrode 9 are omitted. In this case, the metal foil 13 and electric conductor 12 are electrically connected directly with each other.

EXAMPLE 2

Figure 4:
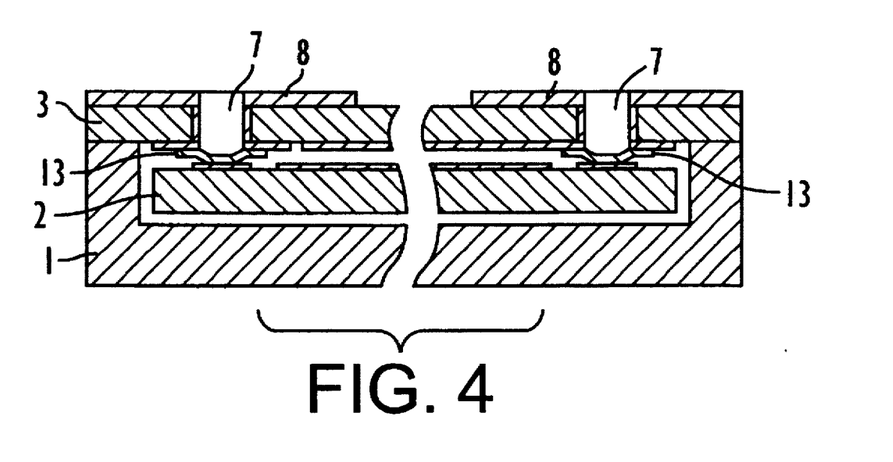
FIG. 4 is a cross-sectional view of an electronic component device of a second embodiment of the present invention.

Next, another exemplary embodiment of the present invention for an electronic component device will be explained. FIG. 4 shows a cross-sectional view of an important part of the another exemplary embodiment of the present invention for an electronic component device. In FIG. 4, the same symbols, as used in FIG. 3, are employed to identify each respective member.

The electronic component device as shown in FIG. 4 is different from the device shown in FIG. 3 in that the electronic component element 2 is not fixed by means of an adhesive material to the inner bottom of the saucer shell 1. Instead the element is suspended in the air by means of a metal foil 13 with an air gap created between the bottom of the electronic component element 2 and a saucer shell 1. When the electronic component element 2 is fixed directly onto the saucer shell 1, which has an expansion coefficient different from that of the electronic component element 2, a mechanical stress can be imposed on the electronic component element 2 due to ambient temperature changes. As a result, the characteristics thereof may be altered.

With the present example 2, no adhesive material is used. The electronic component element 2 is fixed inside the device by means of the metal foil 13 to avoid the aforementioned problem. In this example, the metal foil 13 is readily deformed and the electronic component element 2 is allowed to expand or shrink freely. As a result, no mechanical stress is imposed on the electronic component element 2 and changes in the characteristics thereof are less likely to occur.

Each respective member used in the electronic component device of Example 2 is the same as used in the device of Example 1. It is particularly preferred to use a SAW filter as the electronic component element 2 in Example 2.

EXAMPLE 3

Figure 8:
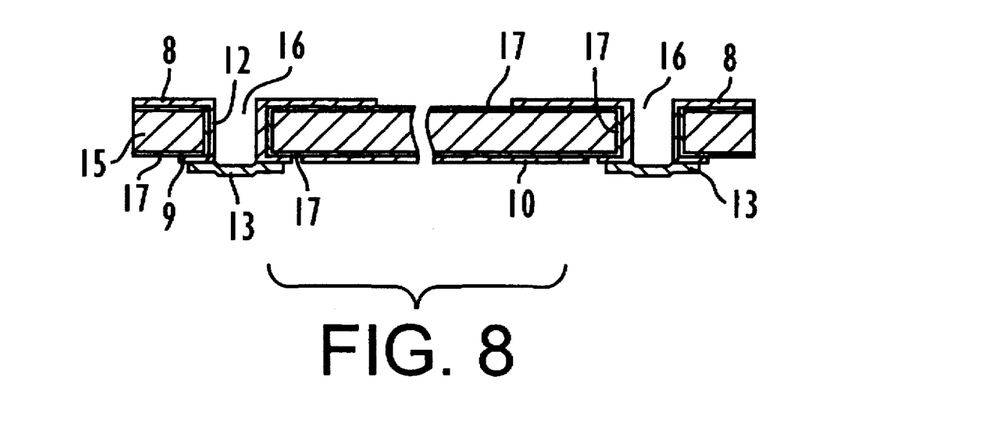
FIG. 8 is a cross-sectional view of a cover of the electronic component device of a third embodiment of the present invention.

Next, still another exemplary embodiment of the present invention for an electronic component device will be explained. As shown in FIG. 8, the cover of the electronic component device of the present example is different from the cover of the foregoing Example 1.

FIG. 8 is a cross-sectional view of an important part of the cover employed in the electronic component device of the present example. All the other structural members are the same as those used in the electronic component device of Example 1.

In FIG. 8, the cover 15 is formed of a thin plate of metal such as Ni(42%)/Fe, Ni(46%)/Fe alloy or the like. The expansion coefficient of said metal is similar to that of glass or alumina.

Through holes 16 are formed in the thin plate of the metal as described above. Insulating layers 17 are disposed on the upper and bottom surfaces of the metallic cover 15, and also, on the inner surfaces of the through holes 16. On the insulting layers 17, electrodes 8 for outside connection, electric conductors 12, shielding electrodes 9, a connecting electrode 10 and metal foils 13 are formed in the same way as in the electronic component device of Example 1. The cover 15 thus structured is joined together with the glass or ceramic saucer shell containing an electronic component element.

The metal foil 13 is preferred to have structures wherein Mo or W is used as a core material, and at least one metal is selected from Au, Sn. Preferably, solder is laminated on the surface of the core material at the side of the cover 15, and either Au or aluminum is laminated on the surface of the core material at the side of the electronic component element.

An organic material such as epoxy resin, polyester resin and the like, or an inorganic material such as glass, ceramics and the like, for example, is used as the insulating layer 17. Structuring the cover in the above-described manner provides the important advantage of further simplifying the production of the through holes 16.

EXAMPLE 4

Figure 9:
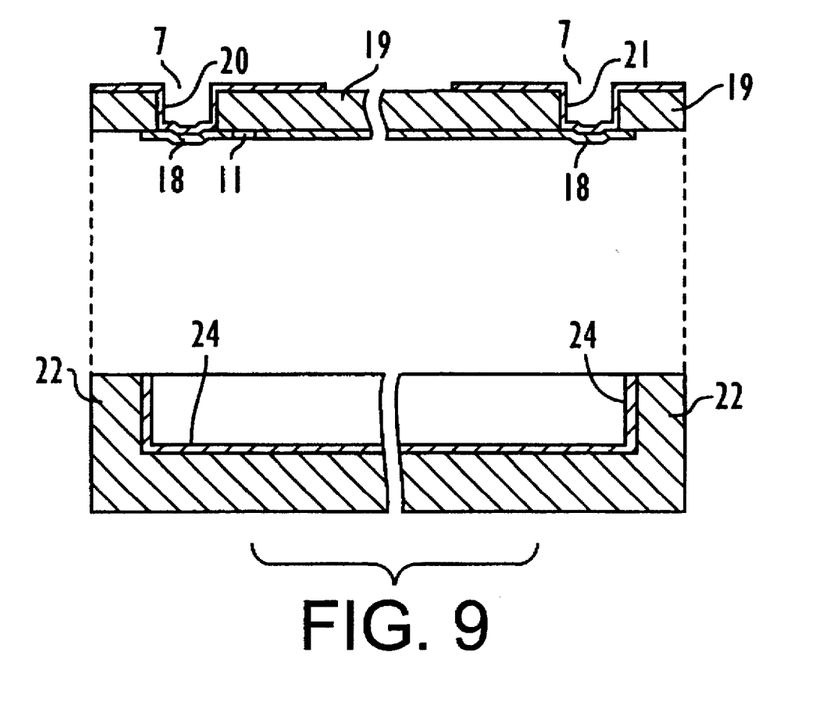
FIG. 9 is an exploded cross-sectional view of a cover and envelope of an electronic component device of a fourth embodiment of the present invention.

Next, a further exemplary embodiment of the prevent invention will be explained. The electronic component device of this particular exemplary embodiment of the present invention is different from that of Example 1 with respect to the structure of the saucer shell and cover serving as the envelope.

FIG. 9 is an exploded cross-sectional view of an important part of the saucer shell and cover serving as the envelope and employed in the electronic component device of the present example. All the other structural members are the same as those used in the electronic component device of Example 1.

In FIG. 9, the envelope is composed of a saucer shell 22 which is formed of resin and open in the upper side, and a cover 19 which is formed of resin and covers the upper opening of the saucer shell 22. A metallic thin layer 24 is disposed all over the inner surfaces of the saucer shell 22 for an anti-moisture provision.

Through holes 7 are formed in the foregoing cover 19. The openings of the through holes 7 facing the electronic component element are covered by a metal foil 18 for an anti-moisture effect and an electro-magnetic shielding effect as well.

Electro-conducting layers 20 and 21 are disposed on the inner side surfaces of the foregoing through holes 7 and on the surfaces of the metal foil 18 exposed to the through holes, respectively.

In this example also, as explained in the foregoing Example 1, a ring-like non-electrode member 11, namely an insulating area, is formed on the through holes 7, thereby separating the metal foil formed on the bottom surface of one through hole from that of the other through hole to establish structures wherein respective electrodes are disposed independently from each other.

The same materials used for the metal foil 13 described in Example 1 are used as the materials for the metal foil 18.

The material for the electro-conducting layers 20 and 21 is the same material as is used for the conductor 12 described in Example 1.

The material used for the saucer shell 22 and cover 19 is typically epoxy resin, phenol resin, various engineering plastics and the like.

EXAMPLE 5

Figure 10:
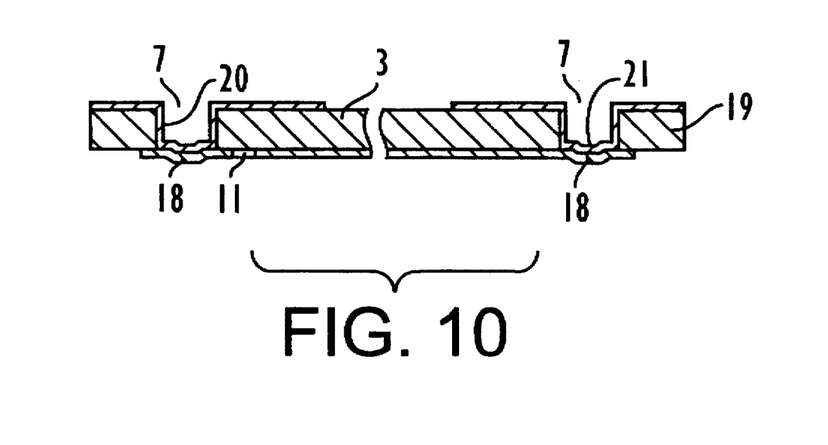
FIG. 10 is a cross-sectional view of a cover of an electronic component device of a fifth embodiment of the present invention.

Next, another exemplary embodiment of the present invention will be explained. The electronic component device of this particular exemplary embodiment of the present invention is different from that of the foregoing Example 1 in the structures of the cover for the envelope.

FIG. 10 is a cross-sectional view of an important part of the cover of the envelope employed in the electronic component device of the present invention. All the other structural members are the same as those used in the electronic component device of Example 1.

As shown in FIG. 10, a metal foil 18 is formed on the electronic component element side of a glass-made cover 3 continuously, covering the openings of through holes 7.

Aluminum is used as the material for the metal foil 13. An area of the metal foil corresponding to a ring-like non-electrode member 11 formed in the periphery of at least one of the through holes 7 is transformed to an aluminum oxide layer region through an anode oxidation processing of aluminum.

In addition, electro-conducting layers 20 and 21 are disposed on the inner side surfaces of the through holes 7 and on the surface of the metal foil 18 exposed to the feed through holes 7, respectively.

Further, the method employed in joining the metal foil 18 made of aluminum and the glass-made cover 3 together may be by way of a direct connection performed according to an electro-static bonding method, in addition to an ordinary bonding method.

The embodiments described above in the foregoing Examples 1 through 5, provide a number of significant advantages. For example, the outside electrodes 8 are electrically connected to the electrodes 6 of an element 2 inside an envelope by means of a metal foil through a through hole, whereby the metal foil is pressed and deformed toward an electrode of the electronic component element. As a result, a direct connection between the metal foil and the electrode 6 can be carried out. The use of the metal foil simplifies the processes for forming the connection between the electrodes 6 formed on the electronic component element 2 and the electric conductors 8 formed on the envelope.

Specifically, there is no need to form conventional projected bumps by plating, thereby eliminating the photoprocessing steps used in plating. As a result, the electrodes formed on a electronic component element, which is hermetically sealed within an envelope, can be easily connected with the electric conductors formed on the outside of the envelope without touching said element. In addition, the element structures have been made simplified with a resultant contribution to realizing a simpler production process.

The above descriptions refer to the electronic component element as a SAW filter. However, the electronic component element that can be enclosed in the electronic component device is not limited to a SAW filter. The electronic component element can be, for example, various types of oscillating devices, such as a quartz crystal oscillator, a ceramic oscillator and the like, or a ceramic filter and the like.

Of course, it should be understood that a wide range of changes and modifications can be made to the preferred embodiment described above. It is therefore intended that the foregoing detailed description be understood that it is the following claims, including all equivalents, which are intended to define the scope of this invention.

What is claimed is:

1. An electronic component device comprising:

an envelope having through holes at specified places thereof;

an electronic component element contained in said envelope and having internal electrodes formed thereon;

electric conductors surrounding each of said through holes on the upper and bottom surfaces of said envelope and also disposed on the inner surfaces of said through holes, with the respective electric conductors associated with each hole being electrically connected together, and with the electric conductors surrounding each of said through holes on the upper surface of said envelope forming external electrodes and the electric conductors surrounding each of said through holes on the bottom surface of said envelope forming connecting electrodes; and metal foils disposed on one end of said respective through holes, which is situated towards the inside of said envelope to seal off the ends of said respective through holes, said metal foils electrically connected to said connecting electrodes and said internal electric conductors.

2. The electronic component device according to claim 1, wherein said envelope is formed from glass, ceramics or resins.

3. The electronic component device according to claim 1, wherein said metal foils are formed from Al alone, Au alone, a laminate of Au and Al, a laminate of Au and Sn, a laminate of Au and solder, a laminate of Al and Sn, a laminate of Al and solder, a laminate of Al and Au and Sn, or a laminate of Al and Au and solder.

4. The electronic component device according to claim 1, wherein said metal foils are formed from a laminate of Au and a barrier layer and Al, a laminate of Au and a barrier layer and Sn, a laminate of Au and a barrier layer and solder, a laminate of Al and a barrier layer and Sn, or a laminate of Al and a barrier layer and solder.

5. The electronic component device according to claim 4, wherein said barrier layer is formed from Mo, Ti, W or Cr.

6. The electronic component device according to claim 1, wherein said internal electrodes disposed on said electronic component element are formed of aluminum, and said metal foils are formed of aluminum.

7. The electronic component device according to claim 1, further comprising shielding electrodes formed on inner surfaces of said envelope in the periphery of at least one of said through holes, and said shielding electrodes, said electric conductors and said metal foils are electrically connected with one another.

8. The electronic component device according to claim 1, wherein said envelope includes:

a saucer shell which has the upper part thereof left uncovered to form an opening; and a cover arranged with said through holes at specified places thereof, and which covers the upper opening of said saucer shell;

wherein said electronic component element is contained in said saucer shell.

9. The electronic component device according to claim 8, wherein said metal foils are formed of laminates from Mo or W as a basic material.

10. The electronic component device according to claim 9, wherein said metal foils have multilayer structures of laminating at least one metal selected from Au, Sn and solder over said cover side surfaces of said basic material, and of laminating at least one metal selected from Au or Al over said electronic component element side surfaces of said basic material.

11. The electronic component device according to claim 1, wherein said envelope includes:

a resin made saucer shell which has a metal film layer formed on the inner surface thereof and has the upper side thereof left uncovered to form an opening; and a resin made cover arranged with said through holes at specified places thereof and disposed to cover the upper opening of said saucer shell;

wherein said electronic component element is contained in said saucer shell.

12. The electronic component device according to claim 11, wherein said metal foils disposed on the bottom surface of said respective though holes are of a flat plate like shape to cover the opening of said saucer shell, and also a non-electrode formed area is disposed in the periphery of at least one of said through holes situated on said metal foils.

13. The electronic component device according to claim 8, wherein said saucer shell is formed of glass or ceramics, and said cover is a substrate formed of a Fe-Ni alloy, having insulating layers disposed on the upper and bottom surfaces of said substrate and also on the inner surfaces of said through holes, wherein said electric conductors are disposed on said insulating layers.

14. The electronic component device according to claim 8, wherein said saucer shell is formed of glass or ceramics, and said metal foils are formed of aluminum; and further comprising, a ring like region of aluminum oxide, which was formed by an anode oxidation method, disposed in the periphery of at least one of said through holes situated on said metal foils.

15. The electronic component device according to claim 14, wherein said metal foils and said cover have been joined together by an electrostatic bonding method.

16. A manufacturing method for an electronic component device comprising the steps of:

(a) placing an electronic component element with internal electrodes formed thereon inside a saucer shell having an uncovered upper side;

(b) forming holes in a cover, said cover having an upper surface and a bottom surface;

(c) forming electric conductors surrounding each of said through holes on the upper and bottom surfaces of said cover and on the inner surfaces of said through holes;

(d) electrically connecting together the respective electric conductors associated with each hole, with the electric conductors surrounding each of said through holes on the upper surface of said cover forming external electrodes and the electric conductors surrounding each of said through holes on the bottom surface of said cover forming connecting electrodes;

(e) disposing metal foils on the bottom surface of said cover over said connecting electrodes, so as to cover said through holes;

(f) assembling an envelope by joining together said cover to said saucer shell having said bottom surface facing towards the inside of the saucer shell; and then (g) inserting jigs into said through holes from the outside of said cover and pressing down said metal foils to join together said internal electrodes formed on said electronic component element and said metal foils at places where said jigs are pressed down.

17. The method for manufacturing an electronic component device according to claim 16, wherein said jigs are ultrasonic transducers, and said electrodes and metal foils are joined together by welding due to an effect of said ultrasonic transducers.

18. An electronic component device comprising:

an envelope having through holes at specified places thereof;

an electronic component element contained in said envelope and having internal electrodes formed thereon;

electric conductors surrounding each of said through holes on the upper and bottom surfaces of said envelope and also, disposed on the inner surfaces of said through holes, with the respective electric conductors associated with each hole being electrically connected together, and with the electric conductors surrounding each of said through holes on the upper surface of said envelope forming external electrodes and the electric conductors surrounding each of said through holes on the bottom surface of said envelope forming connecting electrodes;

metal foils disposed on one end of said respective through holes, which is situated towards the inside of said envelope to seal off the ends of said respective through holes, said metal foils electrically connected to said connecting electrodes and said internal electric conductors; and shielding electrodes formed on inner surfaces of said envelope in the periphery of at least one of said through holes, and said shielding electrodes, said electric conductors and said metal foils are electrically connected with one another.

19. The electronic component device according to claim 18, wherein the electrical connection between said metal foils and said internal electrodes of said electronic component element acts to suspend said electronic component element inside said envelope.

20. An electronic component device comprising:

a resin made saucer shell that has a metal film layer formed on the inner surface thereof and has the upper side thereof left uncovered to form an opening;

a resin made cover arranged with through holes at specified places thereof and disposed to cover the upper opening of said saucer shell;

an electronic component element contained in said saucer shell and having internal electrodes formed thereon;

electric conductors surrounding each of said through holes on the upper and bottom surfaces of said envelope and also, disposed on the inner surfaces of said through holes, with the respective electric conductors associated with each hole being electrically connected together, and with the electric conductors surrounding each of said through holes on the upper surface of said envelope forming external electrodes and the electric conductors surrounding each of said through holes on the bottom surface of said envelope forming connecting electrodes;

metal foils disposed on one end of said respective through holes, which is situated towards the inside of said envelope to seal off the ends of said respective through holes, said metal foils electrically connected to said connecting electrodes and said internal electric conductors; and further having, a non-electrode formed area disposed in the periphery of at least one of said through holes situated on said metal foils.

21. An electronic component device comprising;

a saucer shell that has the upper part thereof left uncovered to form an opening and is formed of glass or ceramics;

a cover arranged with through holes at specified places thereof and disposed to cover the upper opening side of said saucer shell, said saucer shell and said cover being joined together by an electrostatic bonding method;

an electronic component element disposed inside said saucer shell and having internal electrodes formed thereon;

electric conductors surrounding each of said through holes on the upper and bottom surfaces of said envelope and also, disposed on the inner surfaces of said through holes, with the respective electric conductors associated with each hole being electrically connected together, and with the electric conductors surrounding each of said through holes on the upper surface of said envelope forming external electrodes and the electric conductors surrounding each of said through holes on the bottom surface of said envelope forming connecting electrodes;

metal foils disposed on one end of said respective through holes, which is situated towards the inside of said envelope to seal off the ends of said respective through holes, said metal foils electrically connected to said connecting electrodes and said internal electric conductors; and a ring like region of aluminum oxide, which was formed by an anode oxidation method, disposed in the periphery of at least one of said through holes situated on said metal foils.

22. An electronic component device comprising:

an envelope having through holes at specified places thereof;

an electronic component element contained in said envelope and having internal electrodes formed thereon;

electric conductors surrounding each of said through holes on the upper surface of said envelope, disposed on the inner surfaces of said through holes, and covering an end of each hole adjacent the bottom surface of said envelope, with the respective electric conductors associated with each hole being electrically connected together, and with the electric conductors surrounding each of said through holes on the upper surface of said envelope forming external electrodes and the electric conductors covering each of said through holes adjacent the bottom surface of said envelope forming connecting electrodes; and metal foils disposed on a side of said connecting electrodes that is situated towards the inside of said envelope to seal off the ends of said respective through holes, said metal foils electrically connected to said connecting electrodes and said electric conductors.

* * * * *